(12) United States Patent
Kim et al.

(10) Patent No.: US 11,903,282 B2
(45) Date of Patent: *Feb. 13, 2024

(54) DISPLAY APPARATUS AND ELECTRONIC APPARATUS INCLUDING THE SAME

(71) Applicant: Samsung Display Co., Ltd., Yongin-Si (KR)

(72) Inventors: Jae-Kyoung Kim, Hwaseong-si (KR); Ki Seo Kim, Yongin-si (KR); Won Sang Park, Yongin-si (KR); Bong Hyun You, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/088,738

(22) Filed: Dec. 26, 2022

(65) Prior Publication Data

US 2023/0134528 A1    May 4, 2023

Related U.S. Application Data

(63) Continuation of application No. 17/005,846, filed on Aug. 28, 2020, now Pat. No. 11,538,889.

(30) Foreign Application Priority Data

Oct. 31, 2019 (KR) .................. 10-2019-0137292

(51) Int. Cl.
*G09G 5/00* (2006.01)
*H10K 59/131* (2023.01)
(Continued)

(52) U.S. Cl.
CPC .......... *H10K 59/131* (2023.02); *H01Q 1/243* (2013.01); *H10K 50/84* (2023.02); *H10K 59/40* (2023.02);
(Continued)

(58) Field of Classification Search
CPC ...... H10K 59/131; H10K 59/40; H10K 59/65; H10K 50/84; H10K 2102/103; H01Q 1/243
(Continued)

(56) References Cited

U.S. PATENT DOCUMENTS 10,327,341 B2    6/2019 Suzuki et al.
10,437,113 B2 *  10/2019 Lee .................. G02F 1/1303
(Continued)

FOREIGN PATENT DOCUMENTS

CN    109901747 A    6/2019
EP    3664177 A1     6/2020
(Continued)

OTHER PUBLICATIONS

Extended European Search Report for Application No. 20202688.6-1205 dated Mar. 12, 2021.

*Primary Examiner* — Jennifer T Nguyen
(74) *Attorney, Agent, or Firm* — CANTOR COLBURN LLP

(57) ABSTRACT

A display apparatus includes a base substrate including an opening area which transmits light, an opening peripheral area which is a non-display area surrounding the opening area, and a display area surrounding the opening peripheral area, a thin film transistor disposed on the base substrate, a light emitting structure electrically connected to the thin film transistor, and a loop-type antenna electrode disposed on the base substrate in the opening peripheral area to surround the opening area.

20 Claims, 8 Drawing Sheets

(51) Int. Cl.
  *H01Q 1/24* (2006.01)
  *H10K 50/84* (2023.01)
  *H10K 59/40* (2023.01)
  *H10K 59/65* (2023.01)
  *H10K 102/10* (2023.01)

(52) U.S. Cl.
  CPC ....... *H10K 59/65* (2023.02); *H10K 2102/103* (2023.02)

(58) Field of Classification Search
  USPC .......................................................... 345/156
  See application file for complete search history.

(56) References Cited

U.S. PATENT DOCUMENTS

| | | | |
|---|---|---|---|
| 11,538,889 B2 * | 12/2022 | Kim | H10K 59/65 |
| 2014/0028518 A1 * | 1/2014 | Arnold | H01Q 1/2283 |
| | | | 343/841 |
| 2014/0333490 A1 * | 11/2014 | Dabov | H01Q 7/00 |
| | | | 343/702 |
| 2015/0060790 A1 | 3/2015 | Kim et al. | |
| 2015/0253602 A1 | 9/2015 | Kim et al. | |
| 2017/0077597 A1 * | 3/2017 | Gong | H04M 1/026 |
| 2017/0150618 A1 | 5/2017 | Choi et al. | |
| 2018/0034130 A1 | 2/2018 | Jang | |
| 2018/0188432 A1 | 7/2018 | Choi et al. | |
| 2018/0287243 A1 * | 10/2018 | Ko | H01Q 5/30 |
| 2018/0358687 A1 | 12/2018 | Cho et al. | |
| 2019/0066595 A1 | 2/2019 | Kim et al. | |
| 2019/0081389 A1 * | 3/2019 | Tsai | H01Q 1/38 |
| 2019/0212600 A1 | 7/2019 | Yueh et al. | |
| 2020/0136420 A1 | 4/2020 | Jain | |
| 2020/0266542 A1 | 8/2020 | Mu et al. | |
| 2020/0273919 A1 * | 8/2020 | Ding | H10K 50/841 |

FOREIGN PATENT DOCUMENTS

| | | |
|---|---|---|
| JP | 4814223 B2 | 11/2011 |
| KR | 1020160080444 A | 7/2016 |
| KR | 1020170100972 A | 9/2017 |
| KR | 1020180030902 A | 3/2018 |
| KR | 101940797 B1 | 1/2019 |
| KR | 1020190019802 A | 2/2019 |
| KR | 101962819 B1 | 3/2019 |
| KR | 101967771 B1 | 4/2019 |
| KR | 101971441 B1 | 4/2019 |
| KR | 101971490 B1 | 4/2019 |
| KR | 101973742 B1 | 4/2019 |
| KR | 1020190069226 A | 6/2019 |
| KR | 1020190089515 A | 7/2019 |

\* cited by examiner

DISPLAY APPARATUS AND ELECTRONIC APPARATUS INCLUDING THE SAME

This application is a continuation of U.S. patent application Ser. No. 17/005,846, filed on Aug. 28, 2020, which claims priority to Korean Patent Application No. 10-2019-0137292, filed on Oct. 31, 2019, and all the benefits accruing therefrom under 35 U.S.C. § 119, the content of which in its entirety is herein incorporated by reference.

BACKGROUND

1. Field

Embodiments of the invention relate generally to a display apparatus and an electronic apparatus including the display apparatus. More particularly, embodiments of the invention relate to a display apparatus, in which an antenna is embedded and antenna performance is improved, and an electronic apparatus including the display apparatus.

2. Description of the Related Art

Recently, as the display technology improves, display products having smaller sizes, lighter weights, and superior performance have been produced. Conventional cathode ray tube ("CRT") display devices had been widely used due to desired characteristics in terms of performance and price. Recently, however, a display apparatus such as a plasma display apparatus, a liquid crystal display apparatus, and an organic light emitting diode display apparatus has been spotlighted due to desired characteristics such as miniaturization, light weight and low power consumption.

SUMMARY

An electronic apparatus including a display apparatus may include an antenna to perform a communication function. As an area occupied by the display apparatus increases in the electronic apparatus, signal loss and signal blocking phenomena may become severe due to a structural problem of the antenna provided in the electronic apparatus.

Embodiments provide a display apparatus in which an antenna is embedded and antenna performance is improved.

Embodiments provide an electronic apparatus including the display apparatus.

According to an embodiment, a display apparatus includes a base substrate including an opening area which transmits light, an opening peripheral area which is a non-display area surrounding the opening area, and a display area surrounding the opening peripheral area, a thin film transistor disposed on the base substrate, a light emitting structure electrically connected to the thin film transistor, and a loop-type antenna electrode disposed on the base substrate in the opening peripheral area to surround the opening area.

In an embodiment, the display apparatus may further include a thin film encapsulation layer disposed on the light emitting structure. In such an embodiment, the loop-type antenna electrode may be disposed on the thin film encapsulation layer.

In an embodiment, the display apparatus may further include a first wiring connected to an end of the loop-type antenna electrode and a second wiring connected to an opposite end of the loop-type antenna electrode. In such an embodiment, the first wiring and the second wiring may extend to a peripheral area, which is a non-display area surrounding the display area, through the display area.

In an embodiment, the loop-type antenna electrode may include a transparent conductive material.

In an embodiment, a hole or a transparent window may be defined or disposed in the opening area of the base substrate.

In an embodiment, the loop-type antenna electrode may have a C-shape or an O-shape.

In an embodiment, the display apparatus may further include a cover window disposed on the loop-type antenna electrode. In such an embodiment, the loop-type antenna electrode may be disposed between the cover window and the base substrate.

In an embodiment, the display apparatus may further include an optical module disposed to overlap the opening area.

In an embodiment, the display apparatus may further include a driver including a radio frequency integrated circuit ("RFIC") which provides a power to the loop-type antenna electrode.

In an embodiment, the light emitting structure may include a first electrode electrically connected to the thin film transistor, a light emitting layer disposed on the first electrode, and a second electrode disposed on the light emitting layer.

In an embodiment, the display apparatus may further include a shielding electrode disposed in the opening peripheral area between the base substrate and the loop-type antenna electrode.

In an embodiment, the display apparatus may further include a signal line disposed between the shielding electrode and the base substrate.

In an embodiment, the display apparatus may further include another loop-type antenna electrode disposed on the base substrate in the opening peripheral area to surround the opening area, and the another loop-type antenna electrode may be spaced apart from the loop-type antenna electrode. In such an embodiment, the loop-type antenna electrode may surround the second loop-type antenna electrode.

In an embodiment, the display apparatus may further include a touch electrode disposed on the light emitting structure.

In an embodiment, the touch electrode and the loop-type antenna electrode may be disposed in a same layer as each other.

According to an embodiment, an electronic apparatus may include a display apparatus which displays an image, a container which contains the display apparatus, an optical module disposed in the container, and a loop-type antenna disposed in the container. In such an embodiment, the loop-type antenna extends along a surface of the optical module.

In an embodiment, the optical module may include at least one selected from a front camera module, a rear camera module, a face recognition sensor module, a pupil recognition sensor module, an acceleration sensor module, a geomagnetic sensor module, a proximity sensor module, an infrared sensor module, and an illuminance sensor module. In such an embodiment, the loop-type antenna may surround the optical module in the container.

In an embodiment, the display apparatus may include a base substrate including an opening area which transmits light, an opening peripheral area which is a non-display area surrounding the opening area, and a display area surrounding the opening peripheral area, a thin film transistor disposed on the substrate, a light emitting structure electrically connected to the thin film transistor, and another loop-type antenna electrode disposed on the base substrate in the opening peripheral area to surround the opening area.

In an embodiment, the electronic apparatus may further include a side button or an external terminal disposed on a side surface of the container and a second loop-type antenna disposed in the container. In such an embodiment, the second loop-type antenna may extend along a surface of the side button or the external terminal.

According to an embodiment, a display apparatus, including an opening area which transmits light, an opening peripheral area which is a non-display area surrounding the opening area, and a display area surrounding the opening peripheral area, includes an optical module disposed to overlap the opening area and a loop-type antenna electrode disposed in the opening peripheral area to surround the opening area.

In embodiments of the invention, a display apparatus or an electronic apparatus including the display apparatus may include a loop-type antenna or a loop-type antenna electrode which is disposed in a space-efficient manner. Accordingly, in such embodiments, an antenna element may be disposed on a front, side, and/or rear surfaces of the electronic apparatus to be oriented in various directions, and thus performance of the antenna element may be improved.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
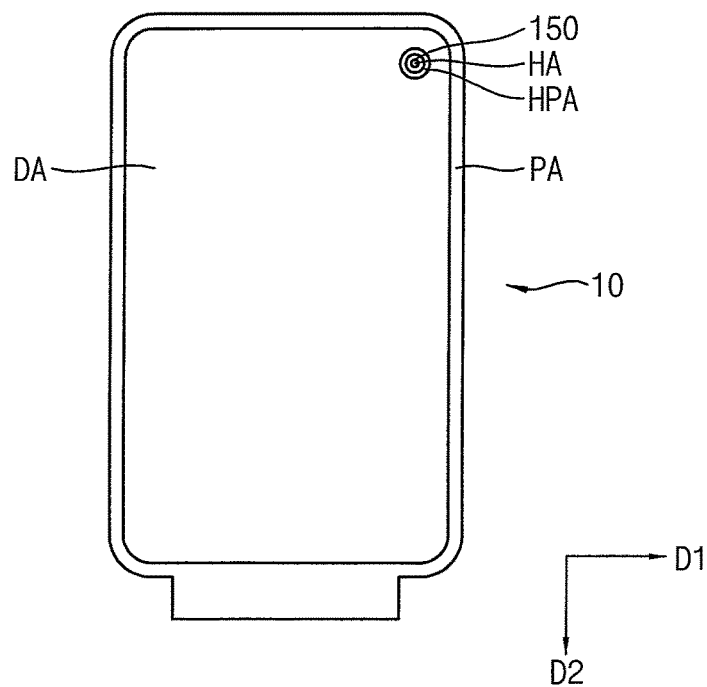
FIG. 1 is a plan view illustrating a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
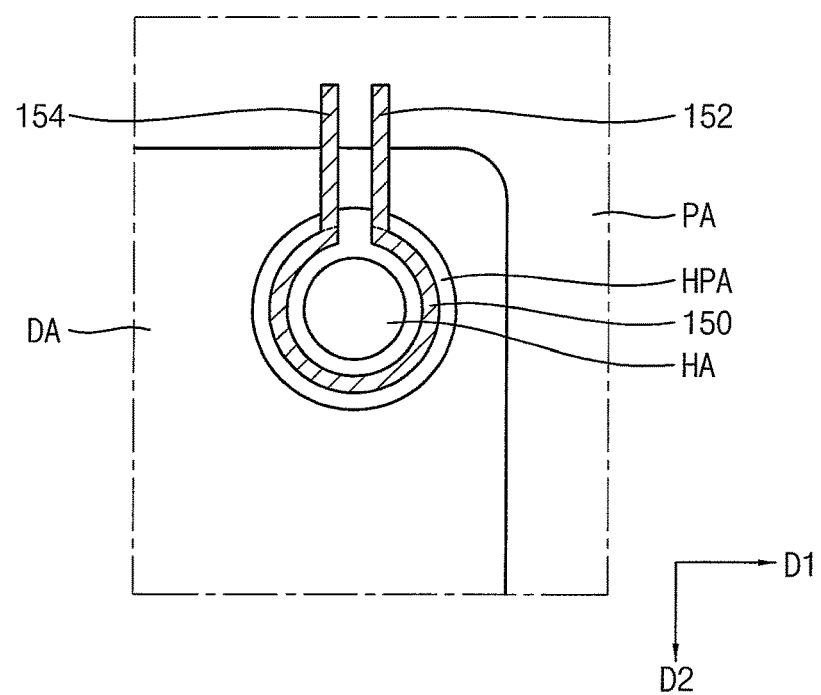
FIG. 2 is a partially enlarged view illustrating a periphery of an opening area of the display apparatus of FIG. 1.

FIG. 1 is a plan view illustrating a display apparatus according to an embodiment, and FIG. 2 is a partially enlarged view illustrating a periphery of an opening area of the display apparatus of FIG. 1.

Referring to FIGS. 1 and 2, an embodiment of the display apparatus may include a display area DA, an opening area HA, an opening peripheral area HPA, and a peripheral area PA.

A plurality of pixels may be disposed in the display area DA to display an image. The display area DA may be disposed on a plane defined by a first direction D1 and a second direction D2, and may have a rectangular shape when viewed from a plan view in a direction perpendicular to the first direction D1 and the second direction D2, or a thickness direction of the display apparatus. In an embodiment, as shown in FIG. 1, the display area DA may have rounded corners, but the embodiments are not limited thereto, and alternatively, the shape of the display area DA may be variously modified to be in one of various shapes.

The peripheral area PA may surround the display area DA, and is a non-display area in which an image is not displayed.

The opening area HA may be surrounded by the opening peripheral area HPA. The opening area HA is an area for installing an optical module, and may transmit light therethrough. In one embodiment, for example, a circular hole may be defined through a substrate in the opening area HA, or a transparent window may be disposed in the opening area HA.

The opening peripheral area HPA may surround the opening area HA, and may be surrounded by the display area DA. The opening peripheral area HPA is a non-display area, and a signal line and the like may be disposed in the opening peripheral area HPA.

In an embodiment, as shown in FIG. 2, a loop-type antenna electrode 150 may be disposed in the opening peripheral area HPA. The loop-type antenna electrode 150 may extend along the opening peripheral area HPA, and may have a C-shape to surround the opening area HA. A first wiring 152 may be connected to an end of the loop-type antenna electrode 150. A second wiring 154 may be connected to an opposite end of the loop-type antenna electrode 150. The first wiring 152 and the second wiring 154 may extend to the peripheral area PA by passing through the display area DA.

An external driver (not shown) may be disposed or provided in the peripheral area PA. In an embodiment, the driver may include a radio frequency integrated circuit ("RFIC") configured to feed a power to the loop-type antenna electrode 150 through the first and second wirings 152 and 154. The RFIC may include a high-power amplifier ("HPA") and a low-noise amplifier ("LNA"). In such an embodiment, a transmission signal transmitted through the HPA may be radiated through the loop-type antenna electrode 150, and a reception signal received through the loop-type antenna electrode 150 may be amplified by the LNA. In an embodiment, the driver may be implemented on an external circuit board electrically connected through the peripheral area PA.

In such embodiment, the loop-type antenna electrode 150 has a C-shape and has opposing ends connected to wirings, respectively, but the embodiments are not limited thereto. In one alternative embodiment, for example, the loop-type antenna electrode may have an O-shape, and may be connected to a single wiring.

The optical module (not shown) may be disposed in the opening area HA, or may overlap the opening area HA. In one embodiment, for example, the optical module may include a camera module for capturing (or recognizing) an image of an object, a face recognition sensor module for detecting a face of a user, a pupil recognition sensor module for detecting a pupil of the user, an acceleration sensor module and a geomagnetic sensor module for determining a movement of the display apparatus, a proximity sensor module and an infrared sensor module for detecting proximity with respect to a front side of the display apparatus, and an illuminance sensor module for measuring a degree of brightness of external (ambient) light, e.g., when left in a pocket or a bag.

Figure 3:
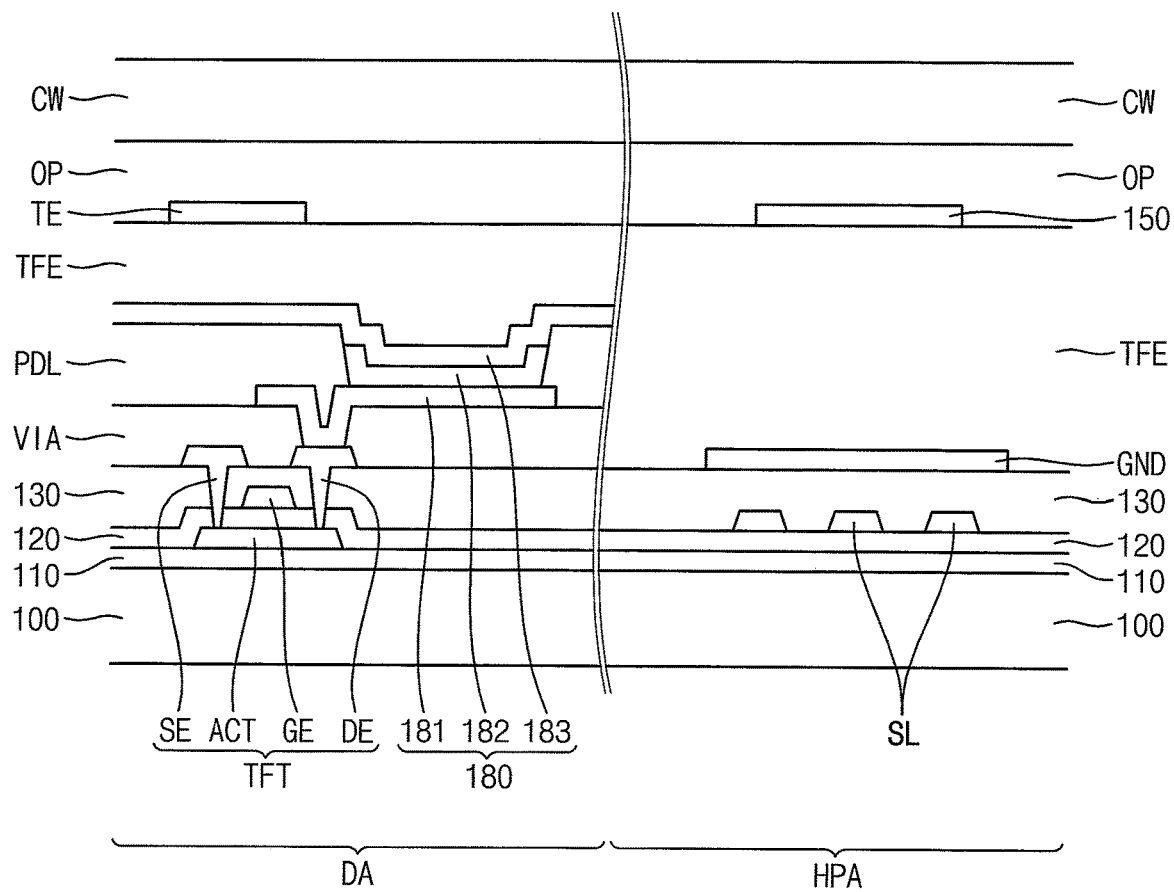
FIG. 3 is a cross-sectional view illustrating a display area and an opening peripheral area of the display apparatus of FIG. 2.

FIG. 3 is a cross-sectional diagram illustrating a display area and an opening peripheral area of the display apparatus of FIG. 2.

Referring to FIGS. 1 to 3, an embodiment of the display apparatus may include a base substrate 100, a buffer layer 110, an active pattern ACT of a thin film transistor TFT, a first insulating layer 120, a gate conductive layer, a second insulating layer 130, a source drain conductive layer, a via insulating layer VIA, a pixel defining layer PDL, a light emitting structure 180, a thin film encapsulation layer TFE, a transparent electrode layer, an optical layer OP, and a cover window CW.

The base substrate 100 may include an opening area HA configured to transmit light, an opening peripheral area HPA which is a non-display area surrounding the opening area HA, and a display area DA surrounding the opening peripheral area HPA. The base substrate 100 may include or be formed of a transparent or opaque material. In one embodiment, for example, the base substrate 100 may include at least one selected from a quartz substrate, a synthetic quartz substrate, a calcium fluoride substrate, a fluorine-doped quartz substrate (F-doped quartz substrate), a soda lime glass substrate, a non-alkali glass substrate, and the like. In an embodiment, the base substrate 100 may be configured as a transparent resin substrate having flexibility. In such an embodiment, the transparent resin substrate that may be used as the base substrate 100 includes a polyimide substrate, for example.

The buffer layer 110 may be disposed over the base substrate 100. The buffer layer may prevent metal atoms or impurities from diffusing from the base substrate 100 into the active pattern ACT, and may control a heat transfer rate during a crystallization process for forming the active pattern ACT to obtain a substantially uniform active pattern ACT.

The active pattern ACT of the thin film transistor TFT may be disposed on the buffer layer 110 in the display area DA. In an embodiment, the active pattern ACT may include an amorphous silicon or a polycrystalline silicon. In an alternative embodiment, the active pattern ACT may include an oxide of at least one material selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). The active pattern ACT may include a drain region and a source region doped with impurities and a channel region disposed between the drain region and the source region.

The first insulating layer 120 may be disposed on the buffer layer 110 on which the active pattern ACT is disposed. The first insulating layer 120 may be disposed along a profile of the active pattern ACT with a substantially uniform thickness to cover the active pattern ACT on the buffer layer 110. The first insulating layer 120 may include at least one material selected from a silicon compound, a metal oxide, and the like. The first insulating layer 120 may have a multi-layer structure including a plurality of layers.

The gate conductive layer may be disposed on the first insulating layer 120. The gate conductive layer may include a gate electrode GE of the thin film transistor TFT disposed in the display area DA, and a signal line SL disposed in the opening peripheral area HPA.

Signals for driving the pixels may be applied to the signal line SL. In one embodiment, for example, the signal line SL may be a scan line, a data line, or the like.

The gate electrode GE may overlap the active pattern ACT in a plan view in a thickness direction of the base substrate 100. The gate conductive layer may include, or be formed by using, at least one material selected from a metal, an alloy, a metal nitride, a conductive metal oxide, a transparent conductive material, and the like.

The second insulating layer 130 may be disposed on the first insulating layer 120 on which the gate conductive layer is disposed. The second insulating layer 130 may include at least one selected from a silicon compound, a metal oxide, and the like. The second insulating layer 130 may have a multi-layer structure including a plurality of layers.

The source drain conductive layer may be disposed on the second insulating layer 130. The source drain conductive layer may include a source electrode SE and a drain electrode SE of the thin film transistor TFT. The source drain conductive layer may further include a shielding electrode GND disposed in the opening peripheral area HPA. The source drain conductive layer may include, or be formed by using, at least one material selected from a metal, an alloy, a metal nitride, a conductive metal oxide, a transparent conductive material, and the like.

Each of the source electrode SE and the drain electrode DE may be electrically connected to the active pattern ACT through a contact hole defined or formed through the second insulating layer 130 and the first insulating layer 120.

The shielding electrode GND may overlap the signal line SL in a plan view in a thickness direction of the base substrate 100. A ground voltage or a constant voltage may be applied to the shielding electrode GND. The shielding electrode GND may be disposed between the loop-type antenna electrode 150 and the signal line SL, which will be described later in greater detail, to block electrical effects between the loop-type antenna electrode 150 and the signal line SL, thereby effectively preventing malfunctions due to the electrical effects.

The via insulating layer VIA may be disposed on the second insulating layer 130 on which the source drain conductive layer is disposed. The via insulating layer VIA may have a single-layer structure, or may have a multi-layer structure including at least two insulating layers. In an embodiment, the via insulating layer VIA may include, or be formed by using, an organic material such as a photoresist, an acryl-based resin, a polyimide-based resin, a polyamide-based resin, and a siloxane-based resin, for example. In an alternative embodiment, the via insulating layer VIA may include, or be formed by using, an inorganic material such as a silicon compound, a metal, and a metal oxide.

The light emitting structure 180 may include a first electrode 181, a light emitting layer 182, and a second electrode 183.

The first electrode 181 may be disposed on the via insulating layer VIA. In an embodiment, the first electrode 181 may be formed by using a reflective material or a transmissive material depending on a light emitting scheme of the display apparatus. In one embodiment, for example, the first electrode 181 may include at least one material selected from aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and a combination thereof. In an embodiment, the first electrode 181 may have a single-layer structure or a multilayer structure including a metal film, an alloy film, a metal nitride film, a conductive metal oxide film, and/or a transparent conductive material film.

The pixel defining layer PDL may be disposed on the via insulating layer VIA on which the first electrode 181 is disposed. The pixel defining layer PDL may include, or be formed by using, at least one material selected from an organic material, an inorganic material, and the like. In one embodiment, for example, the pixel defining layer PDL may be formed by using at least one material selected from a photoresist, a polyacryl-based resin, a polyimide resin, an acryl-based resin, a silicon compound, and the like. In an embodiment, the pixel defining layer PDL may be etched to form an opening which partially exposes the first electrode 181. The display area and the non-display area of the display apparatus may be defined by the opening of the pixel defining layer PDL. For example, a portion where the opening of the pixel defining layer PDL is located may correspond to a light emitting area, and a portion of the pixel defining layer PDL adjacent to the opening of the pixel defining layer PDL may correspond to a light non-emitting area.

The light emitting layer 182 may be disposed on the first electrode 181 exposed through the opening of the pixel defining layer PDL. In such an embodiment, the light emitting layer 182 may extend on a side wall of the opening of the pixel defining layer PDL. In an embodiment, the light emitting layer 182 may have a multilayer structure including an organic light emitting layer, a hole injection layer, a hole transport layer, an electron transport layer, an electron injection layer, and the like. In an alternative embodiment, the layers of the light emitting layer 182 except for the organic light emitting layer, e.g., the hole injection layer, the hole transport layer, the electron transport layer, the electron injection layer and the like, may be commonly formed to correspond to the plurality of pixels. The organic light emitting layer of the light emitting layer 182 may include, or be formed by using, at least one material selected from light emitting materials for generating different color lights such as red light, green light, and blue light corresponding to each pixel of the display apparatus. In an embodiment, the organic light emitting layer of the light emitting layer 182 may have a structure in which a plurality of light emitting materials for implementing different color lights such as red light, green light, and blue light are stacked to emit white light. In such an embodiment, the light emitting structure may be commonly formed to correspond to the pixels, and the pixels may be classified into different color pixels based on a color filter layer corresponding thereto.

The second electrode 183 may be disposed on the pixel defining layer PDL and the light emitting layer 182. In an embodiment, the second electrode 183 may include a transmissive material or a reflective material depending on a light emitting scheme of the display apparatus. In one embodiment, for example, the second electrode 183 may include at least one material selected from aluminum, an aluminum-containing alloy, aluminum nitride, silver, a silver-containing alloy, tungsten, tungsten nitride, copper, a copper-containing alloy, nickel, chromium, chromium nitride, molybdenum, a molybdenum-containing alloy, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, and a combination thereof. In an embodiment, the second electrode 183 may have a single-layer structure or a multilayer structure including a metal film, an alloy film, a metal nitride film, a conductive metal oxide film, and/or a transparent conductive material film.

The thin film encapsulation layer TFE may be disposed on the second electrode 183. The thin film encapsulation layer TFE may prevent moisture and oxygen from penetrating therethrough from an outside. The thin film encapsulation layer TFE may include an organic layer and an inorganic layer. The organic layer and the inorganic layer may be alternately (or repeatedly) stacked on each other. In one embodiment, for example, the thin film encapsulation layer TFE may include a first inorganic layer, a second inorganic layer, and an organic layer disposed between the first inorganic layer and the second inorganic layer, but the embodiments are not limited thereto. In an alternative embodiment, a sealing substrate may be provided instead of the thin film encapsulation layer to block external air and moisture from penetrating into the display apparatus.

The transparent electrode layer may be disposed on the thin film encapsulation layer TFE. The transparent electrode layer may include a touch electrode TE disposed in the display area DA, and a loop-type antenna electrode 150 disposed in the opening peripheral area HPA. The transparent electrode layer may include a transparent conductive material. In one embodiment, for example, the transparent electrode layer may include at least one material selected from indium-zinc oxide ("IZO"), indium-tin-zinc oxide ("ITZO"), zinc oxide ($ZnO_x$), indium-tin oxide ("ITO"), and the like.

The transparent electrode layer may further include first and second wirings (see 152 and 154 of FIG. 2) connected to the loop-type antenna electrode 150.

The optical layer OP may be disposed on the thin film encapsulation layer TFE on which the transparent electrode layer is disposed. The optical layer OP may be, for example, a polarizer for reducing reflection of external light. The optical layer OP may be implemented in a form of a film, and may be attached by using a pressure-sensitive adhesive ("PSA").

The cover window CW may be disposed on the optical layer OP. In an embodiment, the cover window CW may include a glass window. In an alternative embodiment, the cover window CW may be a transparent flexible film such as ultra-thin glass and transparent polyimide. The cover window CW may be attached onto the optical layer OP by using a PSA and the like.

In an embodiment, as described above, the signal line SL may be disposed or formed in the gate conductive layer, and the shielding electrode GND may be disposed or formed in a same layer as the source drain conductive layer, but the embodiments are not limited thereto. In one alternative embodiment, for example, the signal line SL may be disposed or formed in a same layer as the source drain conductive layer or may be defined or formed by a separate or different conductive layer from the source drain conductive layer. In one alternative embodiment, for example, the shielding electrode may be formed in a same layer as the first electrode 181 or may be defined or formed by a separate or different conductive layer from the first electrode 181. In such an embodiment, the loop-type antenna electrode may be defined or formed by another conductive layer.

Figure 4:
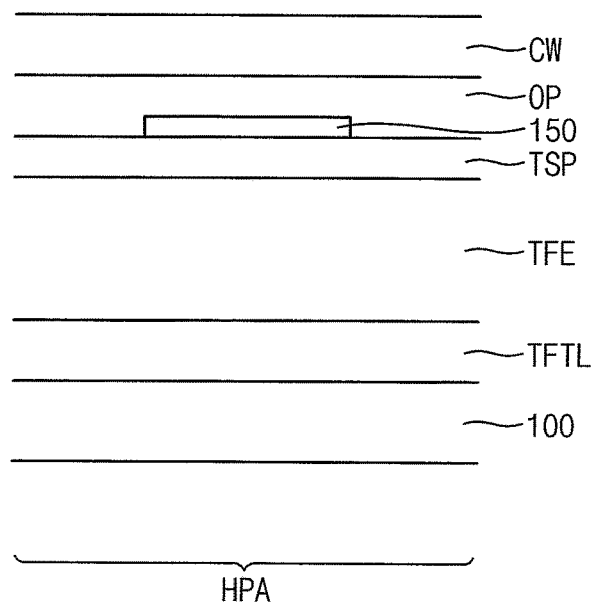
FIG. 4 is a cross-sectional view illustrating an opening peripheral area of a display apparatus according to an alternative embodiment.

FIG. 4 is a cross-sectional diagram illustrating an opening peripheral area of a display apparatus according to an alternative embodiment.

An embodiment of the display apparatus shown in FIG. 4 is substantially the same as the embodiments of the display apparatus described above with reference to FIGS. 1 to 3 except that the loop-type antenna electrode 150 is disposed on a touch screen panel TSP. The same or like elements shown in FIG. 4 have been labeled with the same reference characters as used above to describe the embodiments of the display apparatus shown in FIGS. 1 to 3, and any repetitive detailed description thereof will hereinafter be omitted or simplified.

An embodiment of the display apparatus may include a base substrate 100, a thin film transistor layer TFTL, a thin film encapsulation layer TFE, a touch screen panel TSP, an optical layer OP, and a cover window CW. The thin film transistor layer TFTL may include a thin film transistor and a plurality of insulating layers.

The touch screen panel TSP may be disposed on the thin film encapsulation layer TFE. The touch screen panel TSP may include a touch electrode. In one embodiment, for example, the touch screen panel TSP may be attached onto the thin film encapsulation layer TFE by using a PSA and the like after the touch electrode is formed on a separate base film.

In an embodiment, the loop-type antenna electrode 150 may be disposed on the touch screen panel TSP. In such an embodiment, the loop-type antenna electrode 150 and the touch electrode of the touch screen panel TSP may be disposed or formed in different layers from each other.

The optical layer OP may be disposed on the thin film encapsulation layer TFE on which the transparent electrode layer is disposed. The cover window CW may be disposed on the optical layer OP.

Figure 5:
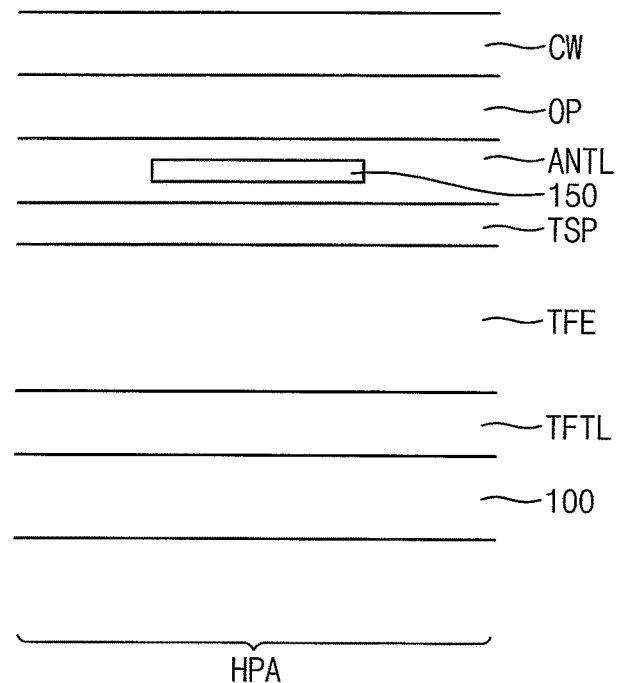
FIG. 5 is a cross-sectional diagram illustrating an opening peripheral area of a display apparatus according to another alternative embodiment.

FIG. 5 is a cross-sectional diagram illustrating an opening peripheral area of a display apparatus according to another alternative embodiment.

An embodiment of the display apparatus shown in FIG. 5 is substantially the same as the embodiments of the display apparatus described above with reference to FIGS. 1 to 3 except that an antenna layer ANTL including the loop-type antenna electrode 150 is attached onto the touch screen panel TSP in a form of a separate film. The same or like elements shown in FIG. 5 have been labeled with the same reference characters as used above to describe the embodiments of the display apparatus shown in FIGS. 1 to 3, and any repetitive detailed description thereof will hereinafter be omitted or simplified.

An embodiment of the display apparatus may include a base substrate 100, a thin film transistor layer TFTL, a thin film encapsulation layer TFE, a touch screen panel TSP, an antenna layer ANTL, an optical layer OP, and a cover window CW. The thin film transistor layer TFTL may include a thin film transistor and a plurality of insulating layers.

The touch screen panel TSP may be disposed on the thin film encapsulation layer TFE. The touch screen panel TSP may be attached onto the thin film encapsulation layer TFE by using a PSA and the like.

The antenna layer ANTL may include a loop-type antenna electrode 150 and an insulating layer. The antenna layer ANTL may be attached onto the touch screen panel TSP by using a PSA and the like after the loop-type antenna electrode 150 is formed on a separate base film.

In such embodiment, as shown in FIG. 5, the antenna layer ANTL may be disposed on the touch screen panel TSP, but the embodiments are not limited thereto. In one embodiment, for example, the antenna layer ANTL may be disposed between the touch screen panel TSP and the thin film encapsulation layer TFE, and the antenna layer ANTL and the touch screen panel TSP may be provided in a form of a single film.

Figure 6:
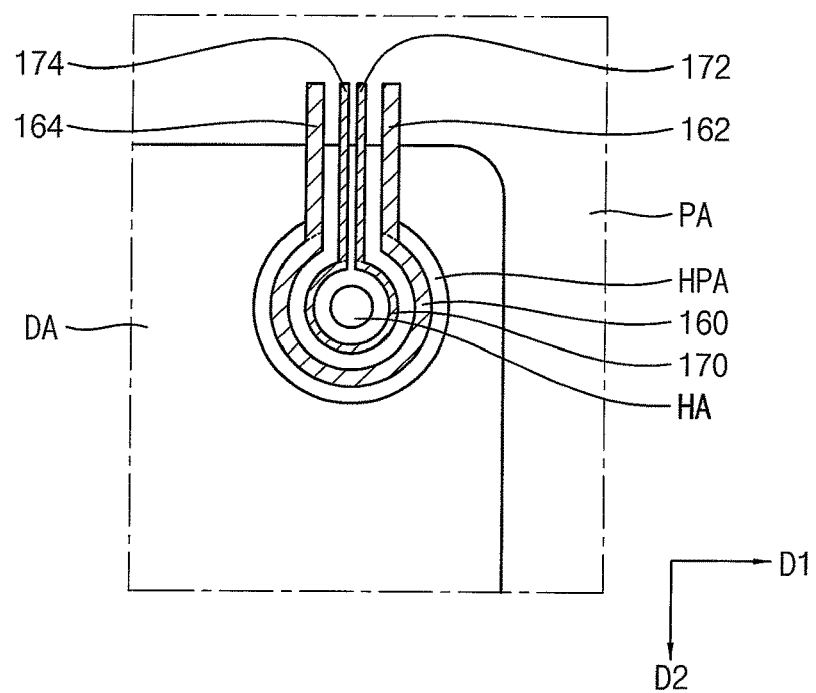
FIG. 6 is a partially enlarged view illustrating a periphery of an opening area of a display apparatus according to an alternative embodiment.

FIG. 6 is a partially enlarged view illustrating a periphery of an opening area of a display apparatus according to an alternative embodiment.

An embodiment of the display apparatus shown in FIG. 6 is substantially the same as the embodiments of the display apparatus described above with reference to FIGS. 1 to 3 except that two loop-type antenna electrodes are provided in the form of concentric circles. The same or like elements shown in FIG. 6 have been labeled with the same reference characters as used above to describe the embodiments of the display apparatus shown in FIGS. 1 to 3, and any repetitive detailed description thereof will hereinafter be omitted or simplified.

An embodiment of the display apparatus may include a display area DA, an opening area HA, an opening peripheral area HPA, and a peripheral area PA.

In such an embodiment, a loop-type antenna electrode (hereinafter, a first loop-type antenna electrode) 160 may be disposed in the opening peripheral area HPA. The first loop-type antenna electrode 160 may extend along the opening peripheral area HPA, and may have a C-shape to surround the opening area HA. A first wiring 162 and a second wiring 164 may be connected to an end and an opposite end of the first loop-type antenna electrode 160, respectively. The first wiring 162 and the second wiring 164 may extend to the peripheral area PA by passing through the display area DA.

In such embodiment, another loop-type antenna electrode (hereinafter, a second loop-type antenna electrode) 170 may be disposed in the opening peripheral area HPA and may be spaced apart from the first loop-type antenna electrode 160. The second loop-type antenna electrode 170 may extend along the opening peripheral area HPA, and may have a C-shape to surround the opening area HA. A third wiring 172 and a fourth wiring 174 may be connected to an end and an opposite end of the second loop-type antenna electrode 170, respectively. The third wiring 172 and the fourth wiring 174 may extend to the peripheral area PA by passing through the display area DA.

An external driver (not shown) may be disposed or provided in the peripheral area PA.

Each of the first loop-type antenna electrode 160 and the second loop-type antenna electrode 170 may receive or transmit signals having mutually different phases from each other to implement beam forming.

In such an embodiment, the loop-type antennas may be provided in a dual arrangement, but the embodiments are not limited thereto. Alternatively, the loop-type antennas may be provided in a triple or quadruple arrangement.

Figure 7:
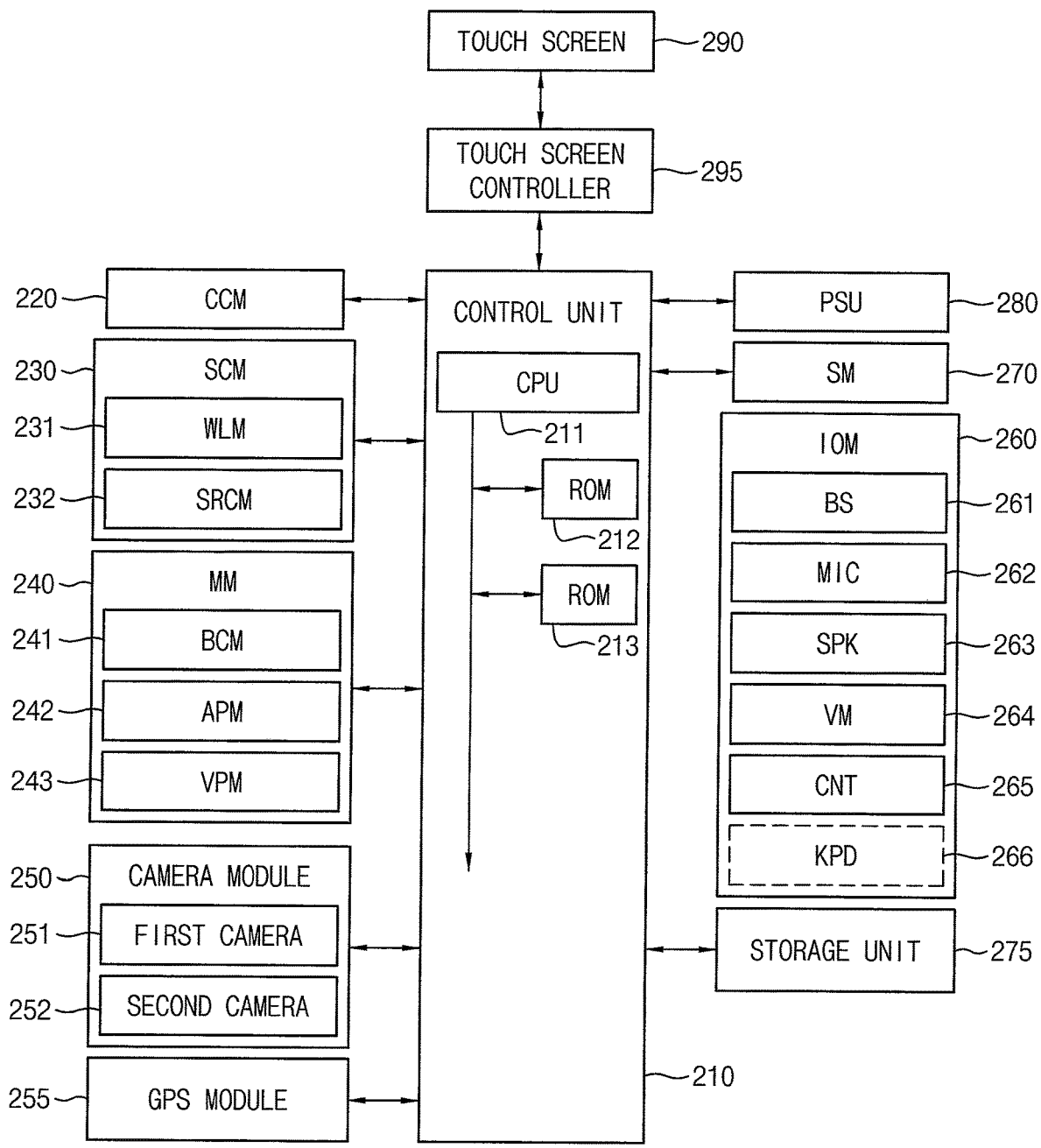
FIG. 7 is a block diagram illustrating a schematic configuration of an electronic apparatus including a display apparatus according to an embodiment.

FIG. 7 is a block diagram illustrating a schematic configuration of an electronic apparatus including a display apparatus according to an embodiment.

Referring to FIG. 7, an embodiment of an electronic apparatus 200 may be connected to an external device (not shown) by using at least one selected from a cellular communication module 220, a sub-communication module 230, and a connector 265. The "external device" may include at least one selected from various other devices, such as a mobile phone, a smart phone, a tablet personal computer ("PC"), and a computer server, for example.

In an embodiment, the electronic apparatus 200 may include a touch screen 290 and a touch screen controller 295. In such an embodiment, the electronic apparatus 200 may further include a control unit 210, a cellular communication module 220 (referred to as CCM in FIG. 7), a sub-communication module 230 (referred to as SCM in FIG. 7), a multimedia module 240 (referred to as MM in FIG. 7), a camera module 250, a global positioning system ("GPS") module 255, an input/output module 260 (referred to as IOM in FIG. 7), a sensor module 270 (referred to as SM in FIG. 7), a storage unit 275, and a power supply unit 280 (referred to as PSU in FIG. 7). The sub-communication module 230 may include at least one selected from a wireless LAN ("WLAN") module 231 (referred to as WLM in FIG. 7) and a short-range communication module 232 (referred to as SRCM in FIG. 7), and the multimedia module 240 may include at least one selected from a broadcast communication module 241 (referred to as BCM in FIG. 7), an audio playback module 242 (referred to as APM in FIG. 7), and a video playback module 243 (referred to as VPM in FIG. 7). The camera module 250 may include a camera, and the input/output module 260 may include at least one selected from a button set 261 (referred to as BS in FIG. 7), a microphone 262 (referred to as MIC in FIG. 7), a speaker 263 (referred to as SPK in FIG. 7), a vibration motor 264 (referred to as VM in FIG. 7), a connector 265 (referred to as CNT in FIG. 7), and a keypad 266 (referred to as KPD in FIG. 7).

The control unit 210 may include a central processing unit ("CPU") 211, a read-only memory ("ROM") 212, in which a control program for controlling the electronic apparatus 200 is stored, and a random access memory ("RAM") 213 configured to store a signal or data input from an outside of the electronic apparatus 200 or serves as a memory space for a task performed by the electronic apparatus 200. The CPU 211 may include at least one selected from a single-core processor, a dual-core processor, a triple-core processor, and a quad-core processor. The CPU 211, the ROM 212, and the RAM 213 may be interconnected to each other through an internal bus.

The control unit 210 may control the cellular communication module 220, the sub-communication module 230, the multimedia module 240, the camera module 250, the GPS module 255, the input/output module 260, the sensor module 270, the storage unit 275, the power supply unit 280, the touch screen 290, and the touch screen controller 295.

The cellular communication module 220 allows the electronic apparatus 200 to be connected to the external device (e.g., a base station of a cellular system) through an antenna or a plurality of antennas by using a wireless access technology according to a cellular communication protocol under the control of the control unit 210. In such an embodiment, the antenna may be disposed on a curved surface of the display apparatus.

The cellular communication module 220 may transmit/receive wireless signals including a voice call, a video call, a short messaging service ("SMS") message, or a multimedia messaging service ("MMS") message to/from other apparatuses capable of performing communication, such as a mobile phone, a smart phone, a tablet PC or other devices corresponding to a phone number input to the electronic apparatus 200.

The sub-communication module 230 may include at least one selected from the WLAN module 231 and the short-range communication module 232. In one embodiment, for example, the sub-communication module 230 may include only the WLAN module 231, may include only the short-range communication module 232, or may include both the WLAN module 231 and the short-range communication module 232.

The WLAN module 231 may be connected to the Internet at a place where a wireless access point (AP; not shown) is installed under the control of the control unit 210. The WLAN module 231 may support a WLAN standard (IEEE802.11x) of the Institute of Electrical and Electronics Engineers ("IEEE").

The short-range communication module 232 may wirelessly perform short-range communication between the electronic apparatus 200 and the external device under the control of the control unit 210. A short-range communication scheme may include Bluetooth®, infrared data association ("IrDA"), and the like.

The electronic apparatus 200 may include at least one selected from the cellular communication module 220, the WLAN module 231, and the short-range communication module 232 based on predetermined operation thereof. In one embodiment, for example, the electronic apparatus 200 may include a combination of the cellular communication module 220, the WLAN module 231, and the short-range communication module 232 based on the predetermined operation thereof.

The multimedia module 240 may include at least one selected from the broadcast communication module 241, the audio playback module 242, and the video playback module 243. The broadcast communication module 241 may receive broadcast signals (e.g., TV broadcast signals, radio broadcast signals, or data broadcast signals) and broadcast additional information (e.g., an electric program guide ("EPS") or an electric service guide ("ESG")) transmitted from a broadcast station through a broadcast communication antenna (not shown) under the control of the control unit 210. The audio playback module 242 may play a digital audio file (e.g., a file with a file extension of mp3, wma, ogg, or way) stored or received under the control of the control unit 210. The video playback module 243 may play a digital video file (e.g., a file with a file extension of mpeg, mpg, mp4, avi, mov, or mkv) stored or received under the control of the control unit 210. The video playback module 243 may play the digital audio file.

In an embodiment, the multimedia module 240 may include the audio playback module 242 and the video playback module 243 except for the broadcast communication module 241. In an alternative embodiment, the audio playback module 242 or the video playback module 243 of the multimedia module 240 may be included in the control unit 210.

The camera module 250 may include a camera for capturing a still image or a video under the control of the control unit 210. The camera may be provided in a housing of the electronic apparatus 200, or may be connected to the electronic apparatus 200 by using a separate connection device. The camera may include an auxiliary light source (e.g., a flash (not shown)) which provides an appropriate amount of light desired for a capturing operation.

The camera module 250 may detect a movement or a shape of a user through the camera, and may transmit the detected movement or shape of the user to the control unit 210 as an input for executing or controlling an application.

Herein, the movement of the user may refer to a movement of a hand of the user detected through the camera, and the shape of the user may refer to a shape of a face of the user detected through the camera. In an alternative embodiment, the electronic apparatus 200 may detect the movement of the user by using another device such as an infrared detector, and may execute or control an application in response to the movement.

In an embodiment, the camera module 250 may include a plurality of cameras. In one embodiment, for example, the camera module 250 may include a first camera 251, which is a front camera module, and a second camera 252 which is a rear camera module.

The GPS module 255 may receive radio waves from a plurality of GPS satellites (not shown) on the earth's orbit, and may calculate a position of the electronic apparatus 200 by using a time of arrival from the GPS satellites (not shown) to the electronic apparatus 200 and GPS parameters.

The input/output module 260 may include at least one selected from the button set (e.g., a physical button) 261, the microphone 262, the speaker 263, the vibration motor 264, the connector 265, and the keypad 266. The button set 261 may be configured as a push-type or touch-type button provided on a front, side, or rear surface of the housing of the electronic apparatus 200, and may include at least one selected from a power/lock button, a volume control button, a menu button, a home button, a back button, and a search button. The microphone 262 may receive a voice or a sound to generate an electrical signal under the control of the control unit 210. The speaker 163 may output sounds corresponding to various signals (e.g., a wireless signal, a broadcast signal, a digital audio file, a digital video file, a photographing operation, or the like) of the cellular communication module 220, the sub-communication module 230, the multimedia module 240, or the camera module 250 to the outside of the electronic apparatus 200 under the control of the control unit 210. The speaker 263 may output a sound (e.g., a button operating sound corresponding to a telephone call, or a ring-back tone) corresponding to a function performed by the electronic apparatus 200. A speaker (or a plurality of speakers) 263 may be provided at a predetermined position or predetermined positions of the housing of the electronic apparatus 200.

In one embodiment, for example, the speaker 263 may include an internal speaker module disposed at a position suitable for approaching an ear of the user during a call and an external speaker module having a higher output suitable to be used while playing an audio/video file or watching a broadcast, and disposed at an appropriate position in the housing of the electronic apparatus 200.

The vibration motor 264 may convert an electrical signal into a mechanical vibration under the control of the control unit 210. In one embodiment, for example, when the electronic apparatus 200 in a vibration mode receives a voice call from another device (not shown), the vibration motor 264 may operate. A single vibration motor 264 or a plurality of vibration motors 264 may be provided in the housing of the electronic apparatus 200. The vibration motor 264 may operate in response to a touch gesture of the user detected on the touch screen 290 and a continuous touch action detected on the touch screen 290.

The connector 265 may be an interface for connecting the electronic apparatus 200 to the external device or a power source. The data stored in the storage unit 275 of the electronic apparatus 200 may be transmitted to or received from the external device through a wired cable connected to the connector 265 under the control of the control unit 210. Through the wired cable connected to the connector 265, a power may be input from the power source, or a battery (not shown) may be charged.

The keypad 266 may receive a key input from a user to control the electronic apparatus 200. The keypad 266 may include a physical keypad provided on or connected to the electronic apparatus 200 and/or a virtual keypad displayed on the touch screen 290. The physical keypad provided on the electronic apparatus 200 may be omitted depending on the performance or a structure of the electronic apparatus 200.

The sensor module 270 may include a sensor for detecting a state of the electronic apparatus 200. In one embodiment, for example, the sensor module 270 may include at least one selected from a proximity sensor for detecting whether a user approaches the electronic apparatus 200, an illuminance sensor for detecting an amount of light in a periphery of the electronic apparatus 200, and a motion sensor for detecting an operation (e.g., a rotation of the electronic apparatus 200, an absolute/relative movement of at least one panel constituting the electronic apparatus 200, acceleration or vibrations applied to the electronic apparatus 200) of the electronic apparatus 200. Each sensor of the sensor module 270 may detect a state, generate a signal corresponding to the detected state, and transmit the generated signal to the control unit 210. The sensor of the sensor module 270 may be additionally provided or omitted according to the predetermined operation of the electronic apparatus 200.

The storage unit 275 may store a signal, information, or data which is input/output correspondingly to an operation of the cellular communication module 220, the sub-communication module 230, the multimedia module 240, the camera module 250, the GPS module 255, the input/output module 260, the sensor module 270, and the touch screen 290 under the control of the control unit 210. The storage unit 275 may store control programs and applications for controlling the electronic apparatus 200 or the control unit 210. Hereinafter, the term "storage unit" may include a memory card (e.g., a secure digital ("SD") card or a memory stick) which may be detachably attached to the storage unit 275, the ROM 212, the RAM 213, or the electronic apparatus 200. In an embodiment, the storage unit may include a nonvolatile memory, a volatile memory, a hard disk drive ("HDD"), or a solid state drive ("SSD").

The power supply unit 280 may supply a power to a battery disposed in the housing of the electronic apparatus 200 under the control of the control unit 210. The battery may supply a power to the control unit 210 and each component module of the electronic apparatus 200. In such an embodiment, the power supply unit 280 may supply a power, which is input from an external power source through the wired cable connected to the connector 265, to the electronic apparatus 200.

The touch screen 290 may refer to a display apparatus for displaying various applications (e.g., a call, data transmission, a broadcast, a camera, and the like) which may be executed by the control unit 210, and providing a user interface adapted to the applications. The touch screen 290 may receive a touch gesture (or action) through a body of the user (e.g., a finger including a thumb) or a detectable input device (e.g., a stylus pen). The user interface may include a predetermined touch area, a soft key, and a soft menu. The touch screen 290 may transmit an electronic signal, which corresponds to the touch gesture input through the user interface, to the touch screen controller 295. In such an embodiment, the touch screen 290 may detect a continuous touch action, and may transmit an electronic signal corresponding to a continuous or discontinuous touch action to the touch screen controller 295. The touch screen 290 may be implemented, for example, in a resistive scheme, a capacitive scheme, an infrared scheme, or an acoustic wave scheme.

The touch screen controller 295 may convert the electronic signal received from the touch screen 290 into a digital signal (e.g., a position on X and Y coordinates) to transmit the digital signal to the control unit 210. The control unit 210 may control the touch screen 290 by using the digital signal received from the touch screen controller 295. In one embodiment, for example, the control unit 210 may allow the soft key displayed on the touch screen 290 to be selected or execute an application corresponding to the soft key in response to the touch gesture. In an alternative embodiment, the touch screen controller 295 may be included in the control unit 210.

Herein, the touch gesture (or action) is not limited to a direct contact between the touch screen 290 and a part of the body of the user or a touchable input device, and includes an indirect contact (e.g., a case where a detectable interval between the touch screen 290 and the body of the user or the touchable input device is 1 millimeter (mm) or less). The detectable interval on the touch screen 290 may vary according to the operation or the structure of the electronic apparatus 200.

In an embodiment, the touch gesture may include all kinds of user gestures or action with a direct contact with the touch screen 290 or an approach in proximity to the touch screen to be detected by the touch screen 290. In one embodiment, for example, the touch gesture may refer to a user's operation of selecting one position or a plurality of consecutive positions on the touch screen by using a finger of left and right hands (especially, an index finger), a thumb, or an object (e.g., a stylus pen) which may be detected by the touch screen 290. The touch gesture may include operations such as a touch, contact, release of a touch, a tap, contact-and-rotate, a pinch, spread, and touch drag. Herein, the touch drag may refer to a gesture of moving the finger or the thumb in a predetermined direction in a state where the finger, the thumb, or the stylus pen makes contact with the touch screen. Herein, the touch drag may include gestures such as touch-and-drag, flick, swipe, slide, and sweep. The state of making contact with the touch screen may include a state where the finger, the thumb, or the stylus pen makes direct contact with the touch screen or approaches in proximity to the touch screen even if the finger, the thumb, or the stylus pen does not actually make direct contact with the touch screen.

The electronic apparatus 200 may refer to an apparatus for executing an application, a widget, and a function, which are stored in the storage unit and may be executed by the control unit 210, through a touch screen. Typically, the touch screen may provide applications, widgets, functions, and graphical objects (i.e., soft keys or shortcut icons) corresponding to groups thereof through a home screen or an application menu, and the electronic apparatus 200 may execute a corresponding application, widget, or function in response to detection of a touch gesture of the user on each graphic object.

Herein, the widget may refer to a mini-application which may be downloaded and used by the user or generated by the user. In one embodiment, for example, the widget may include a weather widget, a stock widget, a calculator widget, an alarm clock widget, a dictionary widget, and the like. The shortcut icon for executing the widget may provide simple dictionary information through a corresponding widget application. In one embodiment, for example, an icon of the weather widget may simply provide a current temperature and a weather symbol, and the widget application executed by touching the icon may provide a greater amount of information such as weather by period/region. Herein, the application may include a widget-based application and a non-widget-based application.

In an embodiment, the touch screen may include a display panel (or tablet), and may display a single task screen or a plurality of task screens corresponding to a single application or a plurality of applications under the control of the control unit. In an alternative embodiment, the touch screen may include two display panels which are physically separated and interconnected by a predetermined connection portion, and the display panels may be folded inwardly or folded outwardly by a predetermined angle with respect to the connection portion. In such an embodiment, the connection portion may be a hinge, a flexible connection portion, or a part of a flexible touch screen. In another alternative embodiment, the touch screen may be configured as a flexible touch screen which may be bent or folded at least once. The touch screen may display a single task screen or a plurality of task screens related to one or a plurality of applications under the control of the control unit.

Figure 8:
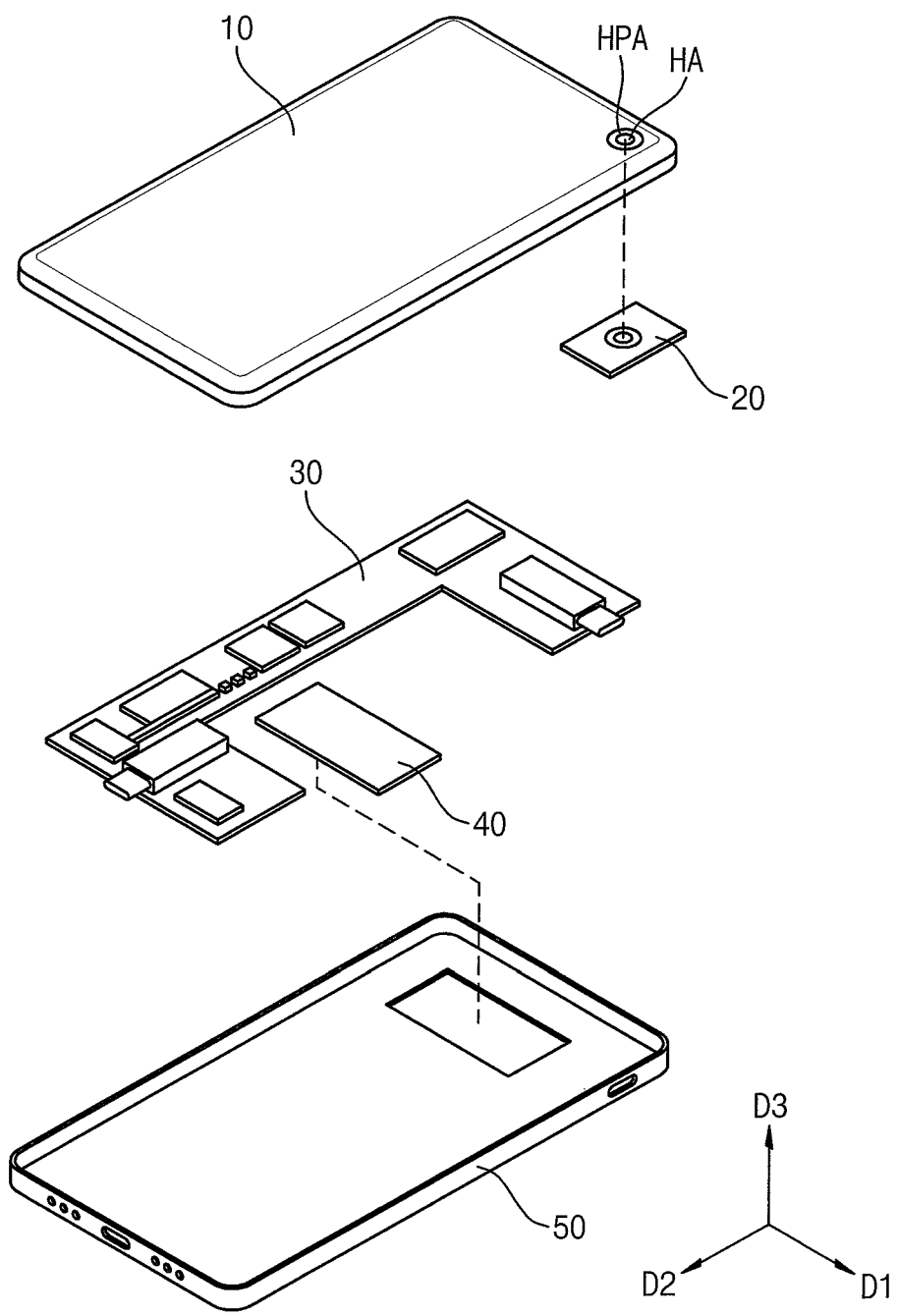
FIG. 8 is an exploded perspective view illustrating an electronic apparatus according to an embodiment.

FIG. 8 is an exploded perspective view illustrating an electronic apparatus according to an embodiment.

Referring to FIG. 8, an embodiment of the electronic apparatus may include a display apparatus 10 for displaying an image, a front camera module 20, a circuit board 30, a rear camera module 40, and a container 50.

In such an embodiment, the display apparatus 10 may be substantially the same as the display apparatus described above with reference to FIGS. 1 to 3. Accordingly, the display apparatus 10 may include a display area DA, an opening area HA, an opening peripheral area HPA, and a peripheral area PA, and may include a loop-type antenna electrode.

The front camera module 20 may be located under the display apparatus 10, and may overlap the opening area HA in a plan view in a thickness direction of the display apparatus 10 or a third direction D3. The front camera module 20 may photograph an object located in a forward direction (e.g., the third direction D3) of the display apparatus 10 through a hole or a transparent window of the display apparatus 10 defined or disposed to overlap the opening area HA.

The circuit board 30 may include various modules (e.g., the multimedia module 240) including the control unit (see 210) described above with reference to FIG. 7, and any repetitive detailed descriptions thereof will be omitted.

The rear camera module 40 may be located under the display apparatus 10, and may photograph an object located in a rearward direction of the display apparatus 10, which is opposite to the direction of a display surface (or the third direction D3) of the display apparatus 10.

The container 50 may accommodate the display apparatus, the front camera module 20, the circuit board 30, and the rear camera module 40. In one embodiment, for example, the container 50 may be combined with the display apparatus 10 to accommodate internal components of the electronic apparatus therein.

Figure 9:
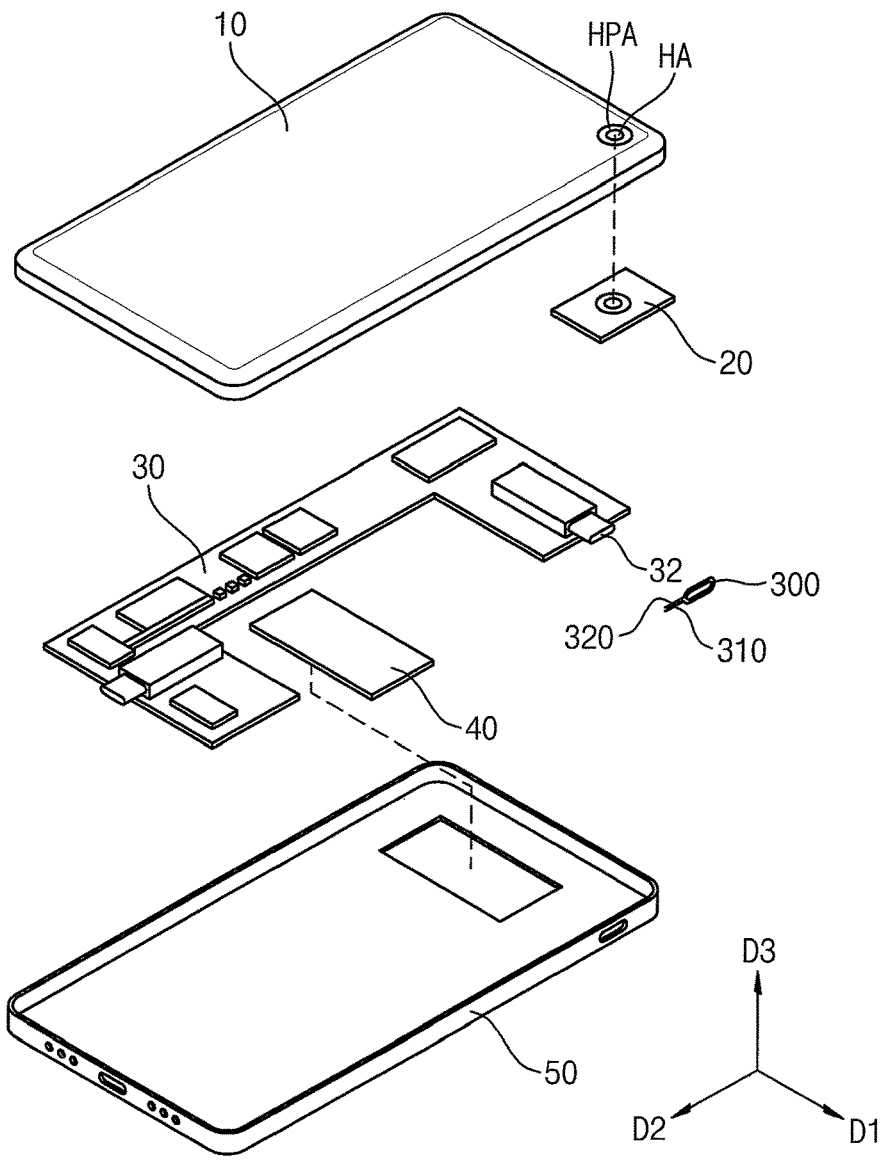
FIG. 9 is an exploded perspective view illustrating an electronic apparatus according to an alternative embodiment.
Figure 10:
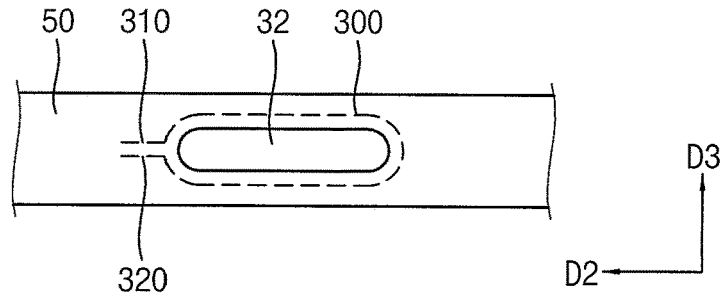
FIG. 10 is a right side view showing a portion of a side button of the electronic apparatus of FIG. 9.

FIG. 9 is an exploded perspective view illustrating an electronic apparatus according to an alternative embodiment, and FIG. 10 is a right side view showing a portion of a side button of the electronic apparatus of FIG. 9.

An embodiment of the electronic apparatus shown in FIGS. 9 and 10 is substantially the same as the embodiment of the electronic apparatus of FIG. 8 except that a loop-type antenna 300 is adjacent to a button 32. The same or like elements shown in FIGS. 9 and 10 have been labeled with the same reference characters as used above to describe the embodiment of the electronic apparatus shown in FIG. 8, and any repetitive detailed description thereof will hereinafter be omitted or simplified.

In an embodiment, the electronic apparatus may include a display apparatus 10 for displaying an image, a front camera module 20, a circuit board 30, a rear camera module 40, a container 50, and a loop-type antenna 300.

The button 32 may be provided on the circuit board 30. The button 32 may be disposed through a side surface of the container 50. The loop-type antenna 300 may be disposed in the container 50, and may extend along a surface of the button 32. A first wiring 310 and a second wiring 320 may be connected to an end and an opposite end of the loop-type antenna 300, respectively. The first and second wirings 310 and 320 may be connected to a driver (not shown) including a RFIC for feeding a power to the loop-type antenna 300. In such an embodiment, the button 32 may correspond to the button 261 of FIG. 7.

In such an embodiment, the components of the electronic apparatus may be efficiently arranged in an internal space, and a communication function of the electronic apparatus in a lateral direction may be improved due to the loop-type antenna 300 located on a side surface of the electronic apparatus.

Figure 11:
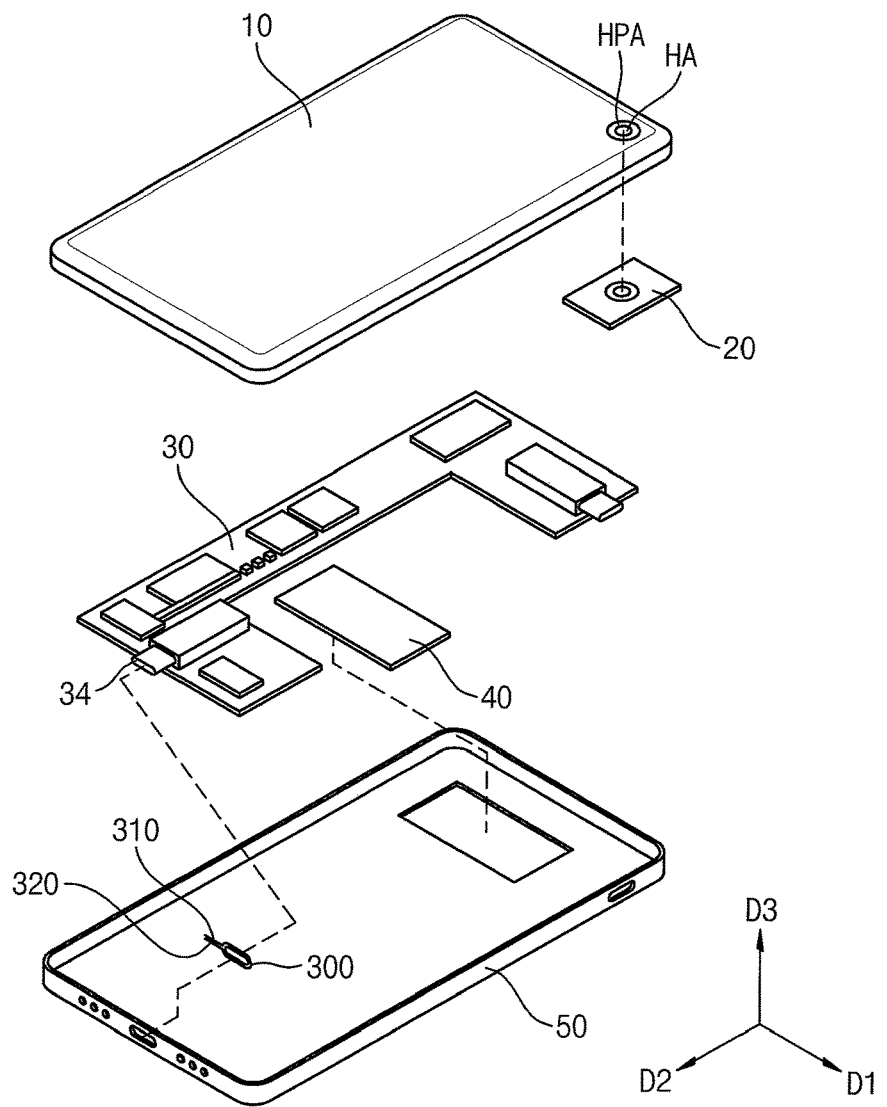
FIG. 11 is an exploded perspective view illustrating an electronic apparatus according to another alternative embodiment.
Figure 12:
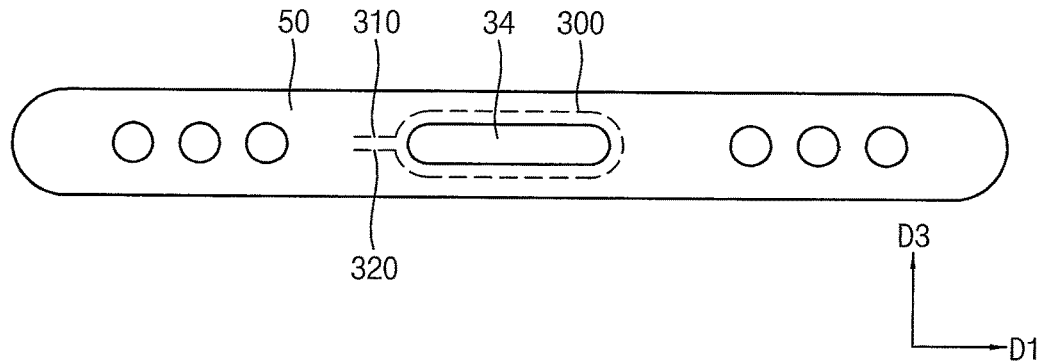
FIG. 12 is a lower side view showing a portion of a charging terminal of the electronic apparatus of FIG. 11.

FIG. 11 is an exploded perspective view illustrating an electronic apparatus according to another alternative embodiment, and FIG. 12 is a lower side view showing a portion of a charging terminal of the electronic apparatus of FIG. 11.

An embodiment of the electronic apparatus shown in FIGS. 11 and 12 is substantially the same as the embodiment of the electronic apparatus of FIG. 8 except that a loop-type antenna 300 is adjacent to a charging terminal 34. The same or like elements shown in FIGS. 11 and 12 have been labeled with the same reference characters as used above to describe the embodiment of the electronic apparatus shown in FIG. 8, and any repetitive detailed description thereof will hereinafter be omitted or simplified.

In an embodiment, the electronic apparatus may include a display apparatus 10 for displaying an image, a front camera module 20, a circuit board 30, a rear camera module 40, a container 50, and a loop-type antenna 300.

The circuit board 30 may be provided with a charging terminal 34 which is an external terminal for establishing connection with the external device.

The charging terminal 34 may be disposed on a lower side surface of the container 50. The loop-type antenna 300 may be disposed in the container 50, and may extend along a surface of the charging terminal 34. A first wiring 310 and a second wiring 320 may be connected to an end and an opposite end of the loop-type antenna 300, respectively. The first and second wirings 310 and 320 may be connected to a driver (not shown) including a RFIC for feeding a power to the loop-type antenna 300. In such an embodiment, the charging terminal 34 may correspond to the connector 265 of FIG. 7.

Figure 13:
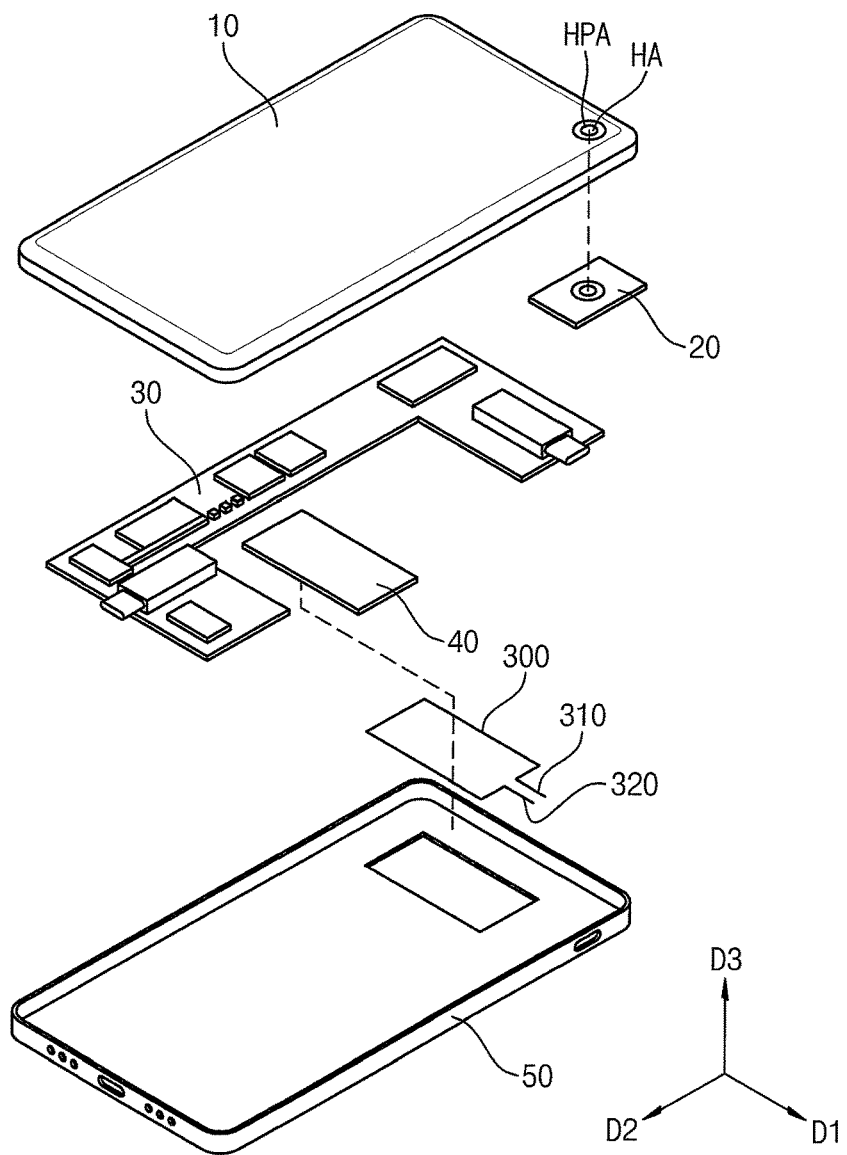
FIG. 13 is an exploded perspective view illustrating an electronic apparatus according to another alternative embodiment.
Figure 14:
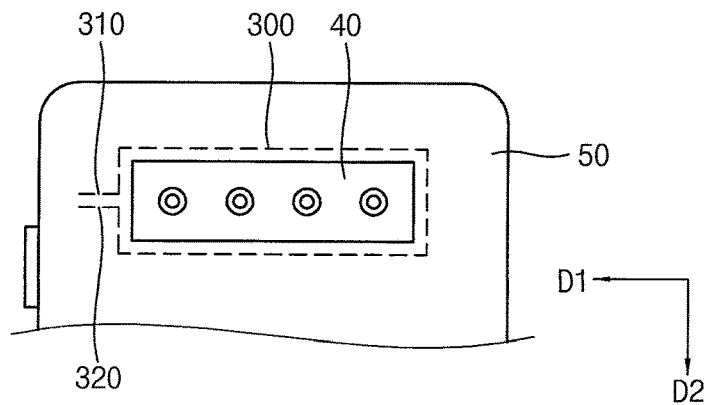
FIG. 14 is a rear view showing a portion of a rear camera module of the electronic apparatus of FIG. 13.

FIG. 13 is an exploded perspective view illustrating an electronic apparatus according to another alternative embodiment, and FIG. 14 is a rear view showing a portion of a rear camera module of the electronic apparatus of FIG. 13.

An embodiment of the electronic apparatus shown in FIGS. 13 and 14 is substantially the same as the embodiment of the electronic apparatus of FIG. 8 except that a loop-type antenna 300 is adjacent to the rear camera module 40. The same or like elements shown in FIGS. 13 and 14 have been labeled with the same reference characters as used above to describe the embodiments of the electronic apparatus shown in FIG. 8, and any repetitive detailed description thereof will hereinafter be omitted or simplified.

In an embodiment, the electronic apparatus may include a display apparatus 10 for displaying an image, a front camera module 20, a circuit board 30, a rear camera module 40, a container 50, and a loop-type antenna 300.

The rear camera module 40 may be disposed on a bottom surface of the container 50, that is, a rear surface of the electronic apparatus. The loop-type antenna 300 may be disposed in the container 50, and may extend along a surface (e.g., side surfaces) of the rear camera module 40. A first wiring 310 and a second wiring 320 may be connected to an end and an opposite end of the loop-type antenna 300, respectively. The first and second wirings 310 and 320 may be connected to a driver (not shown) including a RFIC for feeding a power to the loop-type antenna 300.

In embodiments of the invention, the loop-type antenna of the electronic apparatus or the loop-type antenna electrode embedded in the display apparatus may be implemented as an antenna for a fourth-generation (4G) communication service, and may also be implemented as an antenna for a fifth-generation (5G) communication service.

In such embodiments, a frequency of 2 gigahertz (GHz) or less is mainly used for 4G mobile communication, while a (ultra-) high-band frequency of about 28 GHz or 39 GHz is used for 5G mobile communication unlike 4G Long Term Evolution ("LTE"). A low-band frequency has a long wavelength and thus a wide coverage, but communication using the low-band frequency has a relatively narrow bandwidth and thus a low transmission rate. Herein, the high-band frequency has a short wavelength and thus a narrow coverage, but communication using the high-band frequency has a relatively wide bandwidth and thus a high transmission rate. In addition, the communication using the high-band frequency may resolve coverage constraints to some extent by using high-linearity propagation characteristics of the (ultra-) high-band frequency, an array antenna, and the like. Therefore, the 5G mobile communication may solve the problem of insufficient capacity by increasing the capacity, provide various communication services to the user, and provide a mobile Internet technology and a machine-to-machine ("M2M") technology.

If a conventional printed antenna implemented on a circuit board or a conventional chip antenna disposed on the circuit board is used as an antenna for 5G mobile communication, performance of the antenna for 5G mobile communication may be degraded.

In particular, the printed antenna or the chip antenna has a substantial loss in a 5G frequency band (e.g., 28 GHz or 39 GHz band).

In an embodiment of the invention, the display apparatus or the electronic apparatus includes a loop-type antenna or a loop-type antenna electrode which is disposed in a space-efficient manner. Accordingly, in such an embodiment, an antenna element may be disposed on front, side, and/or rear surfaces of the electronic apparatus to be oriented in various directions, and thus performance of the antenna element may be improved.

Embodiments of the invention may be applied to a display apparatus and an electronic apparatus including the display apparatus, for example, a smart phone, a cellular phone, a video phone, a smart pad, a smart watch, a tablet PC, a car navigation system, a television, a computer monitor, a laptop computer, a head mounted display ("HMD") apparatus, etc.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and detail may be made therein without departing from the spirit and scope of the present disclosure as defined by the following claims.

What is claimed is:

1. A display apparatus comprising:
a base substrate including an opening area which transmits light, an opening peripheral area which is a non-display area surrounding the opening area, and a display area surrounding the opening peripheral area;
a thin film transistor disposed on the base substrate;
a light emitting structure electrically connected to the thin film transistor;
an antenna electrode disposed on the base substrate in the opening peripheral area to surround the opening area;
a shielding electrode entirely disposed in the opening peripheral area between the base substrate and the antenna electrode such that the shielding electrode is overlapped entirely by the opening peripheral area in a plan view; and
a signal line disposed between the shielding electrode and the base substrate.

2. The display apparatus of claim 1, further comprising:
a thin film encapsulation layer disposed on the light emitting structure,
wherein the antenna electrode is disposed on the thin film encapsulation layer.

3. The display apparatus of claim 1, further comprising:
a first wiring connected to an end of the antenna electrode; and
a second wiring connected to an opposite end of the antenna electrode,
wherein the first wiring and the second wiring extend to a peripheral area, which is a non-display area surrounding the display area, through the display area.

4. The display apparatus of claim 1, wherein the antenna electrode includes a transparent conductive material.

5. The display apparatus of claim 1, wherein a hole or a transparent window is defined or disposed in the opening area of the base substrate.

6. The display apparatus of claim 1, further comprising:
a cover window disposed on the antenna electrode,
wherein the antenna electrode is disposed between the cover window and the base substrate.

7. The display apparatus of claim 1, further comprising:
an optical module disposed to overlap the opening area.

8. The display apparatus of claim 1, further comprising:
a driver including a radio frequency integrated circuit which provides a power to the antenna electrode.

9. The display apparatus of claim 1, wherein the light emitting structure includes:
a first electrode electrically connected to the thin film transistor;
a light emitting layer disposed on the first electrode; and
a second electrode disposed on the light emitting layer.

10. The display apparatus of claim 1, further comprising:
another antenna electrode disposed on the base substrate in the opening peripheral area to surround the opening area,
wherein the another antenna electrode is spaced apart from the antenna electrode, and
wherein the antenna electrode surrounds the another antenna electrode.

11. The display apparatus of claim 1, further comprising:
a touch electrode disposed on the light emitting structure.

12. The display apparatus of claim 11, wherein the touch electrode and the antenna electrode are disposed in a same layer as each other.

13. An electronic apparatus comprising:
a display apparatus which displays an image;
an optical module disposed to overlap a portion of the display apparatus; and
a container which contains the display apparatus and the optical module,
wherein the display apparatus includes:
a base substrate including an opening area through which the optical module is at least partially exposed, an opening peripheral area surrounding the opening area, and a display area surrounding the opening peripheral area;
an antenna electrode disposed on the base substrate in the opening peripheral area to surround the opening area;
a shielding electrode entirely disposed in the opening peripheral area between the base substrate and the antenna electrode such that the shielding electrode is overlapped entirely by the opening peripheral area in a plan view; and
a signal line disposed between the shielding electrode and the base substrate.

14. The electronic apparatus of claim 13, wherein the optical module includes at least one selected from a front camera module, a rear camera module, a face recognition sensor module, a pupil recognition sensor module, an acceleration sensor module, a geomagnetic sensor module, a proximity sensor module, an infrared sensor module, and an illuminance sensor module.

15. The electronic apparatus of claim 13, wherein the display apparatus further includes:
a first wiring connected to an end of the antenna electrode; and
a second wiring connected to an opposite end of the antenna electrode,
wherein the first wiring and the second wiring extend to a peripheral area, which is a non-display area surrounding the display area, through the display area.

16. The electronic apparatus of claim 13, wherein the display apparatus further includes:
a cover window disposed on the antenna electrode,
wherein the antenna electrode is disposed between the cover window and the base substrate.

17. The electronic apparatus of claim 13, wherein the antenna electrode includes a transparent conductive material.

18. The electronic apparatus of claim 13, wherein a hole or a transparent window is defined or disposed in the opening area of the base substrate.

19. The electronic apparatus of claim 13, wherein the display apparatus further includes:
another antenna electrode disposed on the base substrate in the opening peripheral area to surround the opening area, and
wherein the another antenna electrode is spaced apart from the antenna electrode.

20. The electronic apparatus of claim 19, wherein the antenna electrode surrounds the another antenna electrode.

* * * * *